(12) United States Patent
Meiser et al.

(10) Patent No.: US 10,109,734 B2
(45) Date of Patent: Oct. 23, 2018

(54) SEMICONDUCTOR DEVICE COMPRISING A TRANSISTOR

(71) Applicant: Infineon Technologies AG, Neubiberg (DE)

(72) Inventors: Andreas Meiser, Sauerlach (DE); Till Schloesser, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/095,615

(22) Filed: Apr. 11, 2016

(65) Prior Publication Data

US 2016/0308044 A1   Oct. 20, 2016

(30) Foreign Application Priority Data

Apr. 14, 2015   (DE) .................. 10 2015 105 632

(51) Int. Cl.
*H01L 29/78*   (2006.01)
*H01L 29/10*   (2006.01)
(Continued)

(52) U.S. Cl.
CPC ........ *H01L 29/7825* (2013.01); *H01L 29/063* (2013.01); *H01L 29/0696* (2013.01);
(Continued)

(58) Field of Classification Search
CPC ............. H01L 29/7825; H01L 29/0696; H01L 29/1095; H01L 29/4236; H01L 29/407; H01L 29/66704
(Continued)

(56) References Cited

U.S. PATENT DOCUMENTS 6,452,231 B1 *   9/2002   Nakagawa .......... H01L 27/0623
257/335
6,559,502 B2 *   5/2003   Hueting .............. H01L 29/0634
257/331
(Continued)

FOREIGN PATENT DOCUMENTS

CN   103681864 A   3/2014
CN   103855221 A   6/2014
(Continued)

OTHER PUBLICATIONS

Office Action communication of the German Patent and Trademark Office for Appln. Ser. No. 10-2016-0106848.9, dated Jan. 11, 2017.
(Continued)

*Primary Examiner* — Jonathan Han
(74) *Attorney, Agent, or Firm* — Slater Matsil, LLP

(57) ABSTRACT

A semiconductor device comprises a transistor in a semiconductor body having a first main surface. The transistor comprises a source region of a first conductivity type, a drain region, a body region of a second conductivity type, different from the first conductivity type, and a gate electrode disposed in gate trenches extending in a first direction parallel to the first main surface. The source region, the body region and the drain region are arranged along the first direction. The body region comprises first ridges extending along the first direction, the first ridges being disposed between adjacent gate trenches in the semiconductor body. The body region further comprises a second ridge. A width of the second ridge is larger than a width of the first ridges, the widths being measured in a second direction perpendicular to the first direction.

19 Claims, 12 Drawing Sheets

(51) Int. Cl.
 *H01L 29/08* (2006.01)
 *H01L 29/66* (2006.01)
 *H01L 29/06* (2006.01)
 *H01L 29/40* (2006.01)
 *H01L 29/417* (2006.01)

(52) U.S. Cl.
 CPC ...... *H01L 29/0865* (2013.01); *H01L 29/0869* (2013.01); *H01L 29/0886* (2013.01); *H01L 29/1095* (2013.01); *H01L 29/407* (2013.01); *H01L 29/4175* (2013.01); *H01L 29/66787* (2013.01); *H01L 29/1083* (2013.01)

(58) Field of Classification Search
 USPC .......... 257/E29.063, E29.198, E29.267, 330, 257/331; 438/270
 See application file for complete search history.

(56) References Cited

U.S. PATENT DOCUMENTS

| | | | |
|---|---|---|---|
| 8,847,311 | B2 | 9/2014 | Meiser |
| 2001/0045599 | A1* | 11/2001 | Hueting ............. H01L 29/4236 257/330 |
| 2002/0020619 | A1 | 2/2002 | Fetzer |
| 2007/0108469 | A1 | 5/2007 | Nakano |
| 2010/0123203 | A1 | 5/2010 | Bhuwalka et al. |
| 2011/0306172 | A1* | 12/2011 | Denison ............ H01L 29/42368 438/270 |
| 2014/0084362 | A1 | 3/2014 | Schloesser |
| 2014/0151798 | A1 | 6/2014 | Meiser |
| 2014/0151804 | A1 | 6/2014 | Meiser |
| 2014/0346590 | A1 | 11/2014 | Mesier et al. |
| 2015/0279978 | A1 | 10/2015 | Meiser |

FOREIGN PATENT DOCUMENTS

| | | |
|---|---|---|
| CN | 104183631 A | 12/2014 |
| DE | 10 2013 113 286 | 6/2014 |
| DE | 102014104589 | 10/2015 |

OTHER PUBLICATIONS

Office Action communication of the German Patent and Trademark Office for Appln. Ser. No. 102015105632.1, dated Dec. 15, 2015.

* cited by examiner

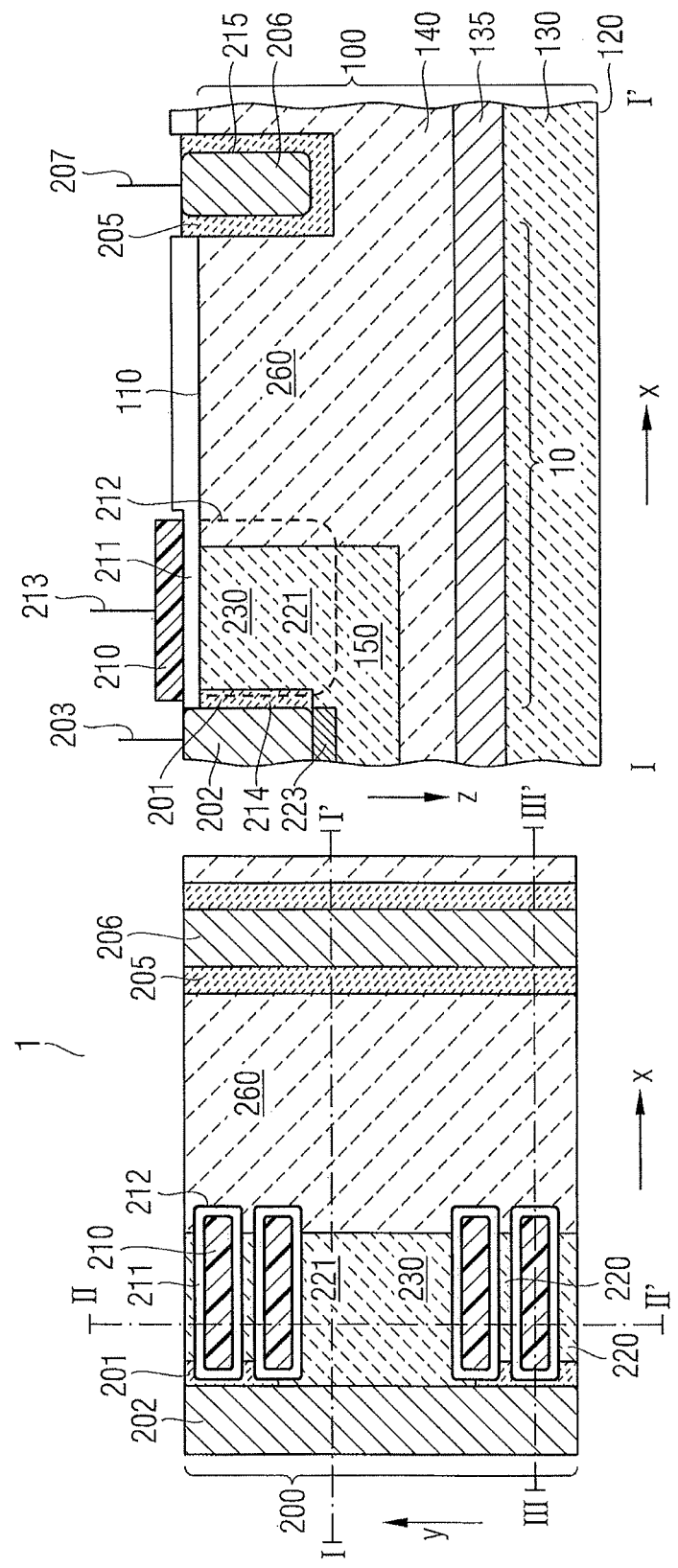

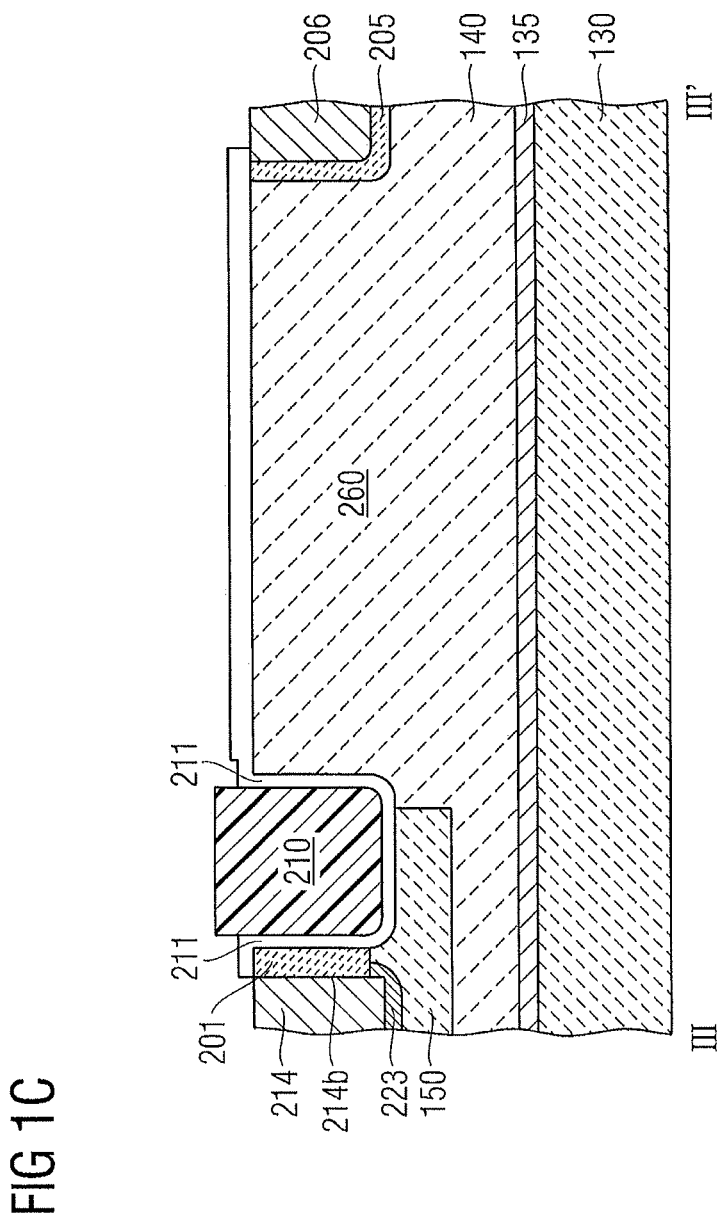

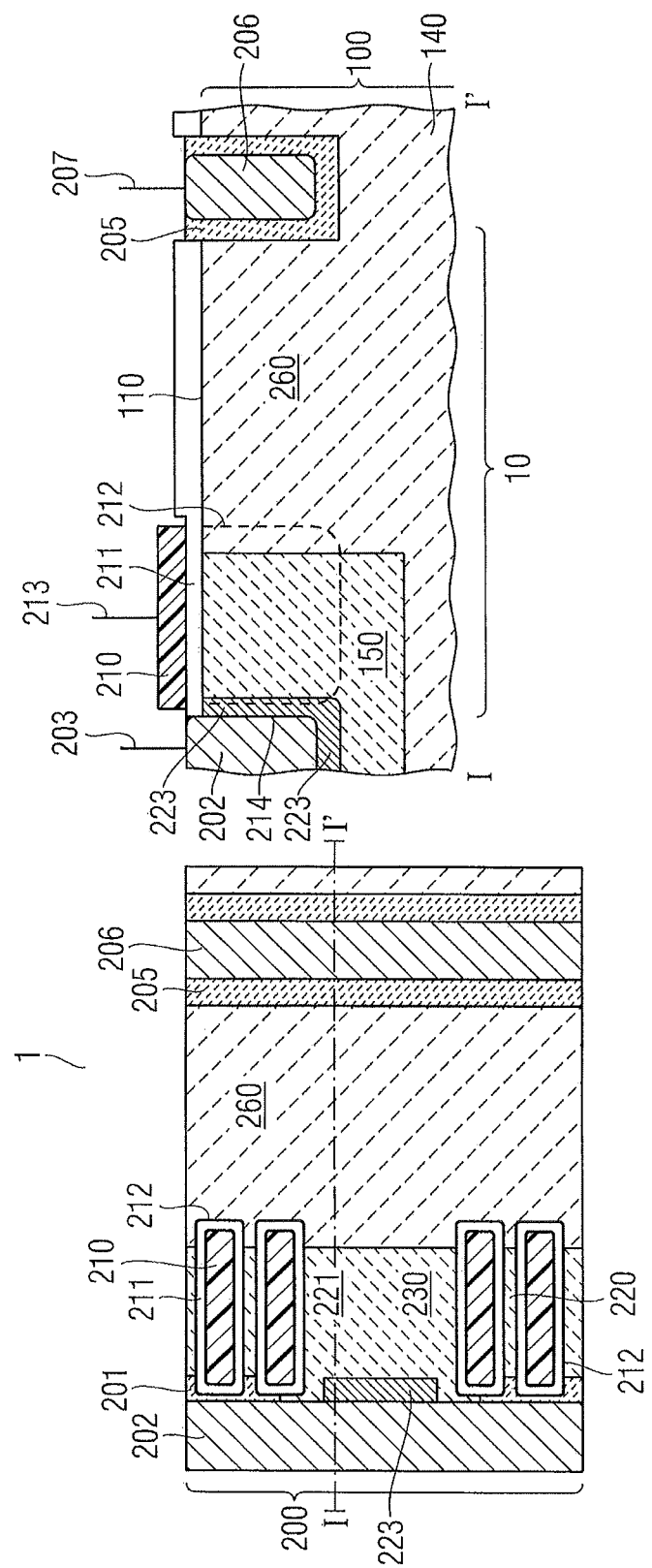

SEMICONDUCTOR DEVICE COMPRISING A TRANSISTOR

CROSS-REFERENCE TO RELATED APPLICATION

This application claims priority to German Application Serial No. 102015105632.1 filed Apr. 14, 2015 and entitled "Semiconductor Device Comprising a Transistor".

BACKGROUND

Power transistors commonly employed in automotive and industrial electronics should have a low on-state resistance ($Rd_{on} \cdot A$), while securing a high voltage blocking capability. For example, a MOS ("metal oxide semiconductor") power transistor should be capable, depending upon application requirements, to block to drain to source voltages $V_{ds}$ of some tens to some hundreds or thousands volts. MOS power transistors typically conduct very large currents which may be up to some hundreds of amperes at typical gate-source voltages of about 2 to 20 V.

A concept for transistors having a further improved $R_{on} \cdot A$ characteristic refers to lateral power FinFET ("field effect transistors comprising a fin"). Lateral power FinFETs utilize more bulk silicon for reducing $R_{on}$ so that $R_{on}$ is comparable to that of a vertical trench MOSFET. In transistors comprising a lateral field plate, the doping concentration of the drift zone may be increased, due to the compensation action of the field plate.

It is an object of the present invention to provide a semiconductor device comprising a transistor having improved properties.

SUMMARY

According to an embodiment, a semiconductor device comprises a transistor in a semiconductor body having a first main surface. The transistor comprises a source region of a first conductivity type, a drain region, a body region of a second conductivity type, different from the first conductivity type, and a gate electrode disposed in gate trenches extending in a first direction parallel to the first main surface. The source region, the body region and the drain region are arranged along the first direction and. The body region comprises first ridges extending along the first direction, the first ridges being disposed between adjacent gate trenches in the semiconductor body. The body region further comprises a second ridge, a width of the second ridge being larger than a width of the first ridges, the widths being measured in a second direction perpendicular to the first direction.

According to a further embodiment, a semiconductor device comprises an array of field effect transistors in a semiconductor body having a first main surface. The array of field effect transistors includes a source region, a drain region, a body region, and a gate electrode disposed in first gate trenches extending in a first direction parallel to the first main surface. The source region, the body region and the drain region are disposed along the first direction between. The first gate trenches are disposed at a first distance along a second direction perpendicular to the first direction parallel to the first main surface. The semiconductor comprises a second gate trench, wherein a second distance between the second gate trench and an adjacent one of the first gate trenches is larger than the first distance.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIG. 1A shows a horizontal cross-sectional view of an example of a semiconductor device according to an embodiment.

FIG. 1B shows a cross-sectional view of the semiconductor device.

FIG. 1C shows a further cross-sectional view of the semiconductor device.

FIG. 2A shows a horizontal cross-sectional view of a semiconductor device according to a further embodiment.

FIG. 2B shows a vertical cross-sectional view of the semiconductor device shown in FIG. 2A.

DETAILED DESCRIPTION

Figure 1D:
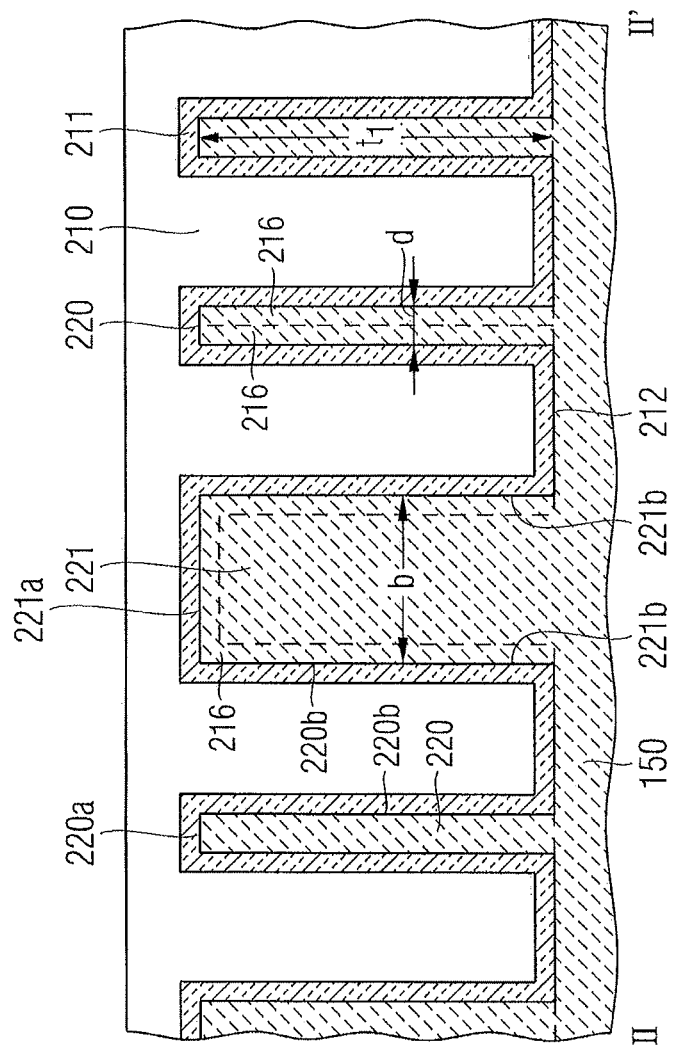
FIG. 1D shows a further cross-sectional view of a portion of the semiconductor device.

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

The present specification refers to a "first" and a "second" conductivity type of dopants, semiconductor portions are doped with. The first conductivity type may be p type and the second conductivity type may be n type or vice versa. As is generally known, depending on the doping type or the polarity of the source and drain regions, insulated gate field effect transistors (IGFETs) such as metal oxide semiconductor field effect transistors (MOSFETs) may be n-channel or p-channel MOSFETs. For example, in an n-channel MOSFET, the source and the drain region are doped with n-type dopants. In a p-channel MOSFET, the source and the drain region are doped with p-type dopants. As is to be clearly understood, within the context of the present specification, the doping types may be reversed. If a specific current path is described using directional language, this description is to be merely understood to indicate the path and not the polarity of the current flow, i.e. whether the current flows from source to drain or vice versa. The Figures may include polarity-sensitive components, e.g. diodes. As is to be clearly understood, the specific arrangement of these polarity-sensitive components is given as an example and may be inverted in order to achieve the described functionality, depending whether the first conductivity type means n-type or p-type.

The Figures and the description illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

The terms "wafer", "substrate", "semiconductor substrate" or "semiconductor body" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

FIG. 1A shows a horizontal cross-sectional view of a semiconductor device according to an embodiment. As will be explained in the following, the semiconductor device 1 comprises a transistor 10 in a semiconductor body having a first main surface. The transistor 10 comprises a source region 201 of a first conductivity type, a drain region 205, a body region 230 of a second conductivity type, different from the first conductivity type, optionally, and a drift zone 260. The transistor 10 further comprises a gate electrode 210 disposed in gate trenches 212. The gate trenches 212 extend in a first direction (e.g. the x direction) parallel to the first main surface. The body region 230 and, optionally, the drift zone 260 are disposed along the first direction between the source region 201 and the drain region 205. The body region 230 comprises first ridges 220 that extend along the first direction. The first ridges 220 are disposed between adjacent gate trenches 212 in the semiconductor substrate. The body region further comprises a second ridge 221. A width of the second ridge 221 is larger than a width of the first ridges 220. The widths are measured in a second direction which is perpendicular to the first direction, e.g. the y-direction.

The gate trenches 212 extend along the body region 230 to the drift zone 260. According to the embodiment shown in FIG. 1A, there may be a small overlap between the gate electrode 210 and the drift zone 260 but the gate trenches 212 may not largely extend within the drift zone 260. According to the embodiment of FIG. 1A, the second ridge 221 is disposed between adjacent gate trenches 212 that are arranged at different pitches. For example, the gate electrode 210 may be arranged on either sides of the second ridge 221. According to a further embodiment, a conductive material in at least one of the gate trenches 212 adjacent to the second ridge 221 may be connected to a terminal different from the gate terminal. According to still a further embodiment, an insulating material may be arranged in at least one of the trenches adjacent to the second ridge 221.

FIG. 1B shows a cross-sectional view of the semiconductor device between I and I', as is also illustrated in FIG. 1A. The cross-sectional view of FIG. 1B is taken so as to intersect through a second ridge 221. As will be further illustrated with reference to FIG. 1D, a plurality of gate trenches 212, each extending along the first direction, pattern the body region 230 into ridges. Accordingly, in the cross-sectional view of FIG. 1B, the gate trenches 212 are disposed before or behind the depicted plane of the drawing. According to an embodiment, a gate electrode 210 may be disposed in each of the gate trenches 212, a gate dielectric 211 such as silicon oxide or silicon nitride being disposed between the gate electrode 210 and the adjacent body region 230. According to further implementations, a material different from a conductive material, e.g. an insulating material, may be disposed in some of the gate trenches 212. Alternatively, the conductive material in some of the gate trenches 212 may be connected to a terminal that is different from the gate terminal 213.

The semiconductor body or semiconductor substrate 100 may comprise a first (bottom) layer 130 of a second conductivity type (e.g. p-type) and an epitaxially grown second layer 140 of a first conductivity type different from the first conductivity type. The second layer 140 is formed over the first layer 130. A further buried layer 135 of the first conductivity type may be disposed between the first layer 130 of the second conductivity type and the second layer 140 of the first conductivity type. The buried layer 135 may be doped at a higher doping concentration than the second layer 140 of the first conductivity type. The components of the field effect transistor 10 may be formed in a well 150 of the second conductivity type, e.g. p-type. The well 150 may be formed in the second layer 140 of the first conductivity type. The drift zone 260 is disposed in the second layer 140 of the second conductivity type. As is illustrated in FIG. 1B, the transistor comprises a source contact 202. The source contact 202 may be implemented by a conductive material that is formed in a source contact groove 214 that is formed in the first main surface 110 of the semiconductor body 100. According to an embodiment, in the region of the second ridge 221, the semiconductor material of the body region 230 may be disposed directly adjacent to the source contact 202. According to a further embodiment, in the region of the second ridge 221, the source region 201 may be disposed between the body region 230 and the source contact 202. For example, as is indicated by broken lines in FIG. 1B, the source region 201 may vertically extend into the semiconductor body 100. The semiconductor device may further comprise a doped layer 223 of the second conductivity type below the source contact 202.

The gate electrode 210 is disposed in the gate trenches 212. Further, a portion of the gate electrode 210 is routed over the plurality of gate trenches so as to be connected to a common gate terminal 213. The gate electrode 210 is insulated from the body region 230 by means of the gate dielectric. The drift zone 260 is disposed between the body region 230 and the drain region 205. The drain contact 206 is disposed in a drain contact groove 215 that is formed in the first main surface 110 of the semiconductor substrate. The drain contact electrically couples the drain region 205 to a drain terminal 207. According to an embodiment, the source contact groove 214 approximately extends to the same depth or to a smaller depth than the gate trenches 212. The drain contact groove 215 may extend to a depth which is approximately equal to the depth of the source contact groove 214. For example, the source contact groove 214 extends to a depth which is at least 0.5 times the depth of the gate trenches 212.

When the transistor is switched on, e.g. by applying a suitable voltage to the gate electrode 210, a conductive inversion layer 216 (conductive channel) is formed at the boundary between the body region 230 and the gate dielectric layer 211. Accordingly, the transistor is in a conducting state from the source region 201 to the drain region 205. In case of switching off, no conductive inversion layer is formed and the transistor is in a non-conducting state.

FIG. 1C shows a cross-sectional view of the semiconductor device between III and III', as is also indicated in FIG. 1A. The cross-sectional view of FIG. 1C is taken so as to intersect across a gate electrode 210. As is shown in FIG. 1C, the source region 201 is disposed between the source contact groove 214 and the gate electrode 210. Moreover, the doped layer 223 of the second conductivity type is disposed adjacent to a bottom side of the source contact groove 214. In the cross-sectional view of FIG. 1C, the body region and the first or second ridge are disposed before and behind the depicted plane of the drawing. As is illustrated in FIG. 1A, the source contact groove 214 and the drain contact groove 215 may extend along the second direction.

FIG. 1D shows a cross-sectional view between II and II', as is also illustrated in FIG. 1A. The cross-sectional view of FIG. 1C is taken so as to intersect a plurality of gate trenches 212. As is illustrated, separated lamellas of semiconductor material of the well portion of the second conductivity type 150 may be patterned by adjacent gate trenches 212. As is further illustrated, the gate trenches 212 are disposed at different pitches, so that the body region 230 is patterned into first ridges 220 and at least one second ridge 221. A width d of the first ridges 220 is smaller than a width b of the second ridge 221. A gate dielectric 211 is disposed adjacent to the sidewalls 220b and to the top surface 220a of each of the ridges. Further, a conductive material is filled in the trenches 212 between adjacent first or second ridges to form the gate electrode 210. As a result, the body region 230 is patterned into the shape of the first ridge extending in the first direction or into the shape of a first fin. At a position that is shifted along the second direction, e.g. the y-axis, the body region has the shape of a second ridge extending in the first direction or the shape of a second fin.

The gate electrode 210 may be disposed adjacent to sidewalls 220b and a top side 220a of the first ridges 220. Further, the gate electrode 210 may be disposed adjacent to sidewalls 221b and a top side 221a of the second ridge 221. According to an embodiment, the width d of the first ridge 220 fulfills d≤2×$l_d$, wherein $l_d$ denotes a length of a depletion zone which is formed at the interface between the gate dielectric layer 211 and the body region 230. For example, the width of the depletion zone may be determined as:

$$l_d = \sqrt{\frac{4\varepsilon_s kT \ln(N_A/n_i)}{q^2 N_A}}$$

wherein $\varepsilon_s$ denotes the permittivity of the semiconductor material (11.9*$\varepsilon_0$ for silicon), k denotes the Boltzmann constant (1.38066*$10^{-23}$ J/K), T denotes the temperature (e.g. 300K), ln denotes the natural logarithm, $N_A$ denotes the impurity concentration of the semiconductor body, $n_i$ denotes the intrinsic carrier concentration (1.45*$10^{10}$ for silicon at 27° C.), q denotes the elementary charge (1.6*$10^{-19}$ C).

Generally, it is assumed that in a transistor, the length of the depletion zone at a gate voltage corresponding to the threshold voltage of the transistor corresponds to the maximum width of the depletion zone. For example, the width of the first ridges may be approximately 20-130 nm, for example, 40-120 nm along the second direction and parallel to the first main surface 110 of the semiconductor body 100.

According to the embodiment, conductive inversion layers 216 formed in the first ridges at opposing sidewalls 220b of a first ridge contact each other when the gate electrode is set to an appropriate potential, for example, when a voltage corresponding to the threshold voltage is applied to the gate terminal. As a consequence, the body region 230 is fully depleted in the first ridge. Such a transistor is also referred to as a "fully depleted" transistor. In such a transistor, an optimal sub-threshold voltage can be achieved and short channel effects may be efficiently suppressed, resulting in improved device characteristics. Further, the conductive inversion channels 216 formed at opposing sidewalls 220b of the second ridge 221 may not contact each other. As a result, the electrical contact between the drift zone 260 and the source contact 202 and the doped layer 223 of the second conductivity type via the body region 230 may be improved. For example, the width of the second ridge may be larger than 100 nm, e.g. larger than approximately 500 nm.

Figure 1E:
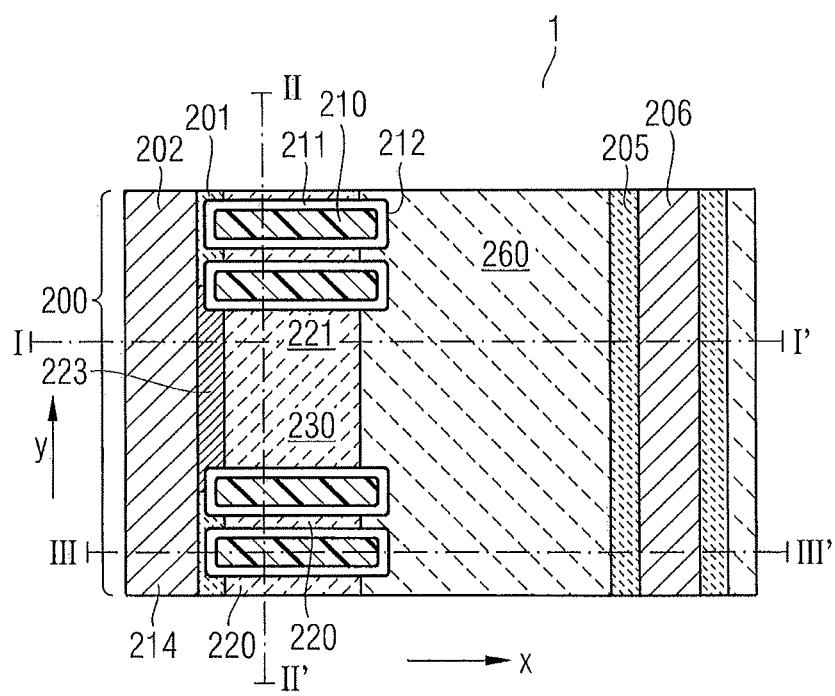
FIG. 1E shows a horizontal cross-sectional view of an example of a semiconductor device according to a further embodiment.

FIG. 1E shows a horizontal cross-sectional view of a semiconductor device 1 according to a further embodiment. Differing from the embodiment illustrated in FIG. 1A, the doped layer 223 of the second conductivity type may be disposed at a sidewall of the source contact 202 so as to be electrically connected to the body region 230 in the region of the second ridge 221 along the horizontal extension of the second ridge 221. As a consequence, generated holes may be removed more effectively, resulting in a better suppression of the parasitic bipolar transistor and the prevention of detrimental effects such as a snap-back effect. This results in an improved save-operating-area (SOA) that corresponds to a region in the I-V characteristics in which the semiconductor device may be safely operated. The doped layer 223 of the second conductivity type may be arranged so as to be in contact with the source region 201. Accordingly, the formation of a transistor in this area may be prevented. As a result, the I-V characteristics of the transistor may be further improved and the steepness of the characteristic may be maintained. The doped layer 223 of the second conductivity type may be arranged adjacent to a sidewall of the source contact groove 214 and may extend to a bottom side of the source contact groove 214.

FIGS. 2A and 2B show a horizontal cross-sectional view and a vertical cross-sectional view of a semiconductor device according to a further embodiment. Many components of the semiconductor device illustrated in FIGS. 2A and 2B are identical to corresponding components of the semiconductor device described with reference to FIGS. 1A to 1D. Differing from the embodiment of FIGS. 1A to 1D, the doped layer 223 of the second conductivity type is disposed in contact with the source contact 202 and the second ridge 221. For example, as illustrated in FIG. 2A, the doped layer 223 of the second conductivity type is disposed at the first main surface 110 so as to electrically connect the body region 230 in the second ridge 221 with the source contact 202 at the first main surface 110. As is further illustrated in FIG. 2B, the doped layer 223 of the second conductivity type vertically extends along the source contact 202. For example, the doped layer 223 may vertically extend from the first main surface 110 along the source contact 202 to the bottom side of the source contact groove 214. For the sake of simplicity, FIG. 2B and the subsequent cross-sectional views do not specifically show the layers which may implement the semiconductor substrate. In the following Figures, further semiconductor layers may be arranged below layer 140 in order to form the semiconductor substrate 100.

According to embodiments described herein, due to the specific structure of the body region 230 comprising first ridges 220 and a second ridge 221, holes which may be generated in the drift zone 260 due to impact ionization may be effectively guided across the body region 230 to the source contact 202, whereby a parasitic bipolar transistor may be deteriorated or even suppressed. In particular, due to the larger width of the second ridge 221, the body region 230 within the second ridge 221 is prevented from being fully depleted so that the holes may be effectively removed from the body region 230 in the region of the second ridge 221. According to embodiments, the source region 201 may be disposed adjacent to the second ridge 221. According to a further embodiment, the source contact 202 may be in direct contact with the second ridge 221. Still further, as is illustrated in FIGS. 2A and 2B, the doped layer 223 of the second conductivity type may be disposed at a sidewall of the source contact 202 so as to be electrically connected to the body region 230 in the region of the second ridge 221 along a large vertical extension. As a consequence, the holes may be removed more effectively, resulting in a better suppression of the parasitic bipolar transistor and the prevention of detrimental effects such as a snap-back effect. This results in an improved save-operating-area (SOA) that corresponds to a region in the I-V-characteristics in which the semiconductor device may be safely operated.

According to the embodiment of FIGS. 1A and 2A, in which the source region is absent from the source contact 202 adjacent to the second ridge 221, the formation of a transistor in this area may be prevented. As a result, the I-V-characteristics of the transistor may be further improved and the steepness of this characteristic may be maintained.

Figure 2C:
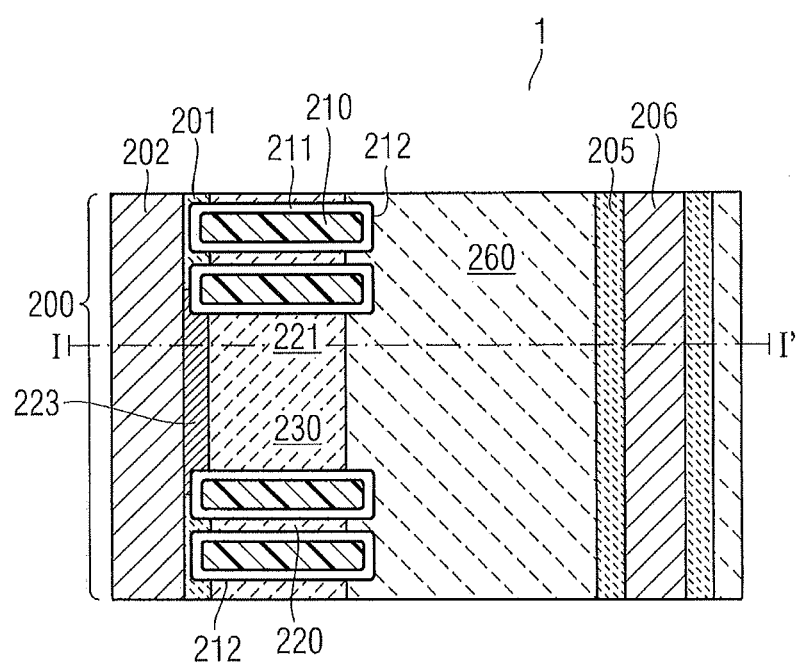
FIG. 2C shows a horizontal cross-sectional view of a semiconductor device according to a further embodiment.

FIG. 2C shows a horizontal cross-sectional view of a part of the semiconductor device according to a further embodiment. According to this embodiment, the doped layer 223 of the second conductivity type is formed so as to be adjacent to the source region 201. Further, the source region is not disposed adjacent to the second ridge 221 of the body region 230. As a result, the holes may be removed even more effectively.

Figure 3B:
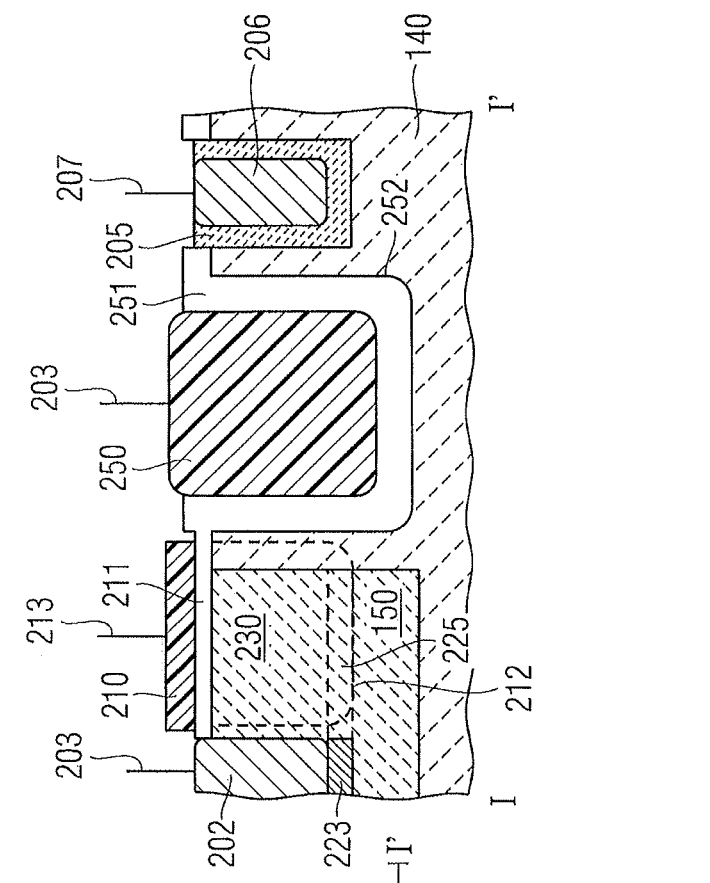
FIG. 3B shows a vertical cross-sectional view of the semiconductor device shown in FIG. 3A.
Figure 3A:
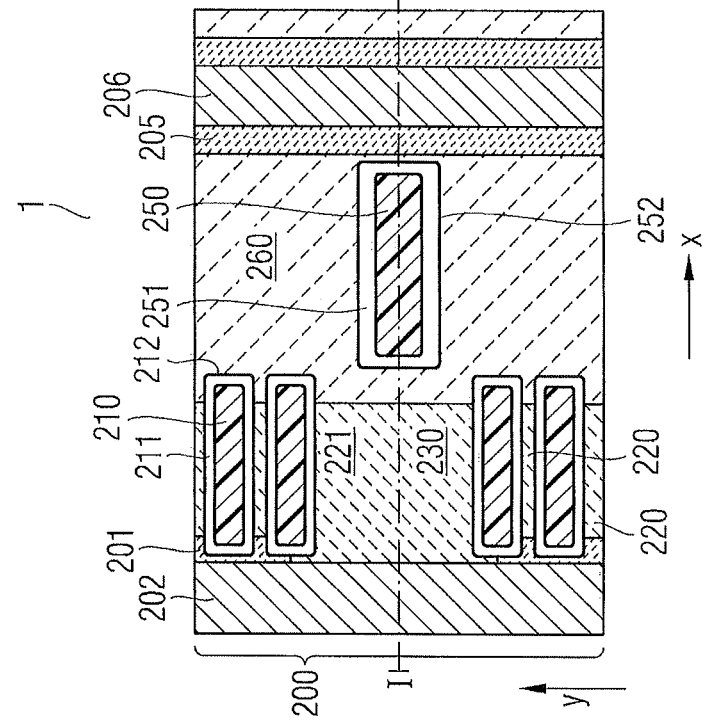
FIG. 3A shows a horizontal cross-sectional view of a semiconductor device according to a further embodiment.

FIGS. 3A and 3B show cross-sectional views of a semiconductor device according to a further embodiment. Differing from the embodiment illustrated in FIG. 1A, the embodiment of FIG. 3A further comprises a field plate 250. According to the embodiment of FIG. 3A, the field plate may be disposed in a field plate trench 252 that is disposed in a first main surface 110 of the semiconductor device. The field plate trench 252 may be disposed in the drift zone 260. For example, the field plate trench 252 may extend to the body region 230. According to a further embodiment, the field plate trench 252 may not extend to the body region 230. A conductive material may be disposed in the field plate trench 252, to form the field plate 250. The field plate 250 may be insulated from the drift zone 260 by a field dielectric layer 251. A thickness of the field dielectric layer 251 may be larger than a thickness of the gate dielectric layer 211. The field plate trench 252 may be disposed so as to be aligned with the second ridge 221 formed in the body region 230. In more detail, the second ridge 221 and the field plate trench 252 may be arranged along the first direction (e.g. x-direction), so that the field plate trench may be arranged next to or adjacent to the second ridge 221.

FIG. 3B shows a vertical cross-sectional view of the device shown in FIG. 3A. For example, the field plate 250 may be electrically connected to a source terminal 203. As is indicated by broken lines, the semiconductor device may further comprise a body contact portion 225 disposed below the body region 230. The body contact portion 225 further improves the electrical connection of the source contact 202 to the drift zone 260 via the body region 230. The body contact portion 225 is electrically and physically connected to the doped layer 223 of the second conductivity type. The doped layer 223 of the second conductivity type is disposed below the source contact 202.

According to further embodiments, the embodiment shown in FIGS. 3A and 3B including the field plate may be modified by implementing the interface between body region and source contact 202 in the manner as illustrated in FIGS. 2A, 2B and further FIG. 1B.

Due to the presence of a field plate, a p-inversion channel may be formed at an interface between the field dielectric layer 251 and the drift zone 260. Accordingly, holes which may be formed in the drift zone 260 may be more effectively guided to the second ridge 221 so that the suppression or deterioration of a parasitic bipolar transistor may be further improved.

Figure 3C:
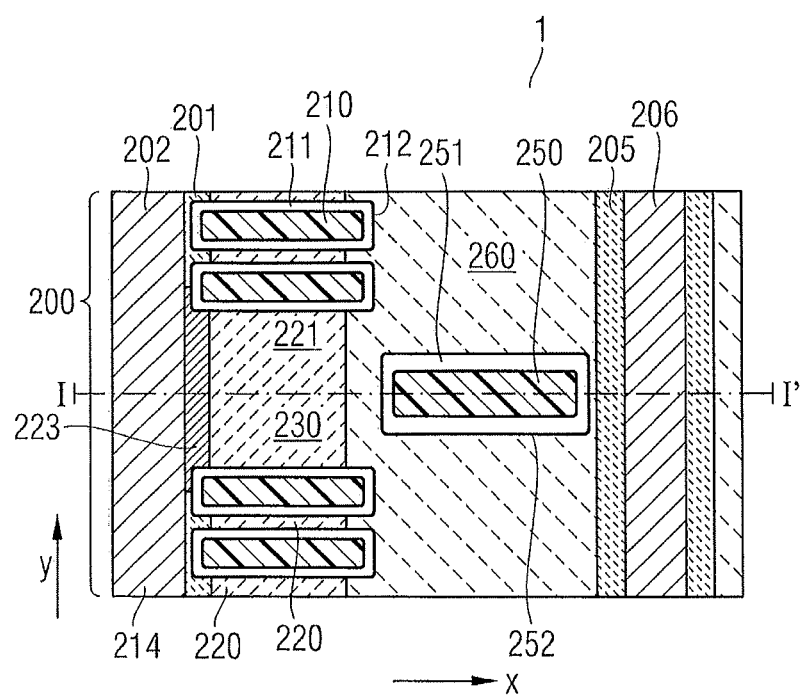
FIG. 3C shows a horizontal cross-sectional view of a semiconductor device according to a further embodiment.

FIG. 3C shows a horizontal cross-sectional view of a semiconductor device according to a further embodiment. As is illustrated, the doped layer 223 of the second conductivity type is disposed at a sidewall of the source contact groove 214 so as to be in contact with the body region 230 formed in the second ridge 221. As a consequence, the holes which may be formed in the drift zone 260 and which may be effectively guided to the second ridge 221 may be removed by the doped layer 223 of the second conductivity type.

Figures 4A, 4B:
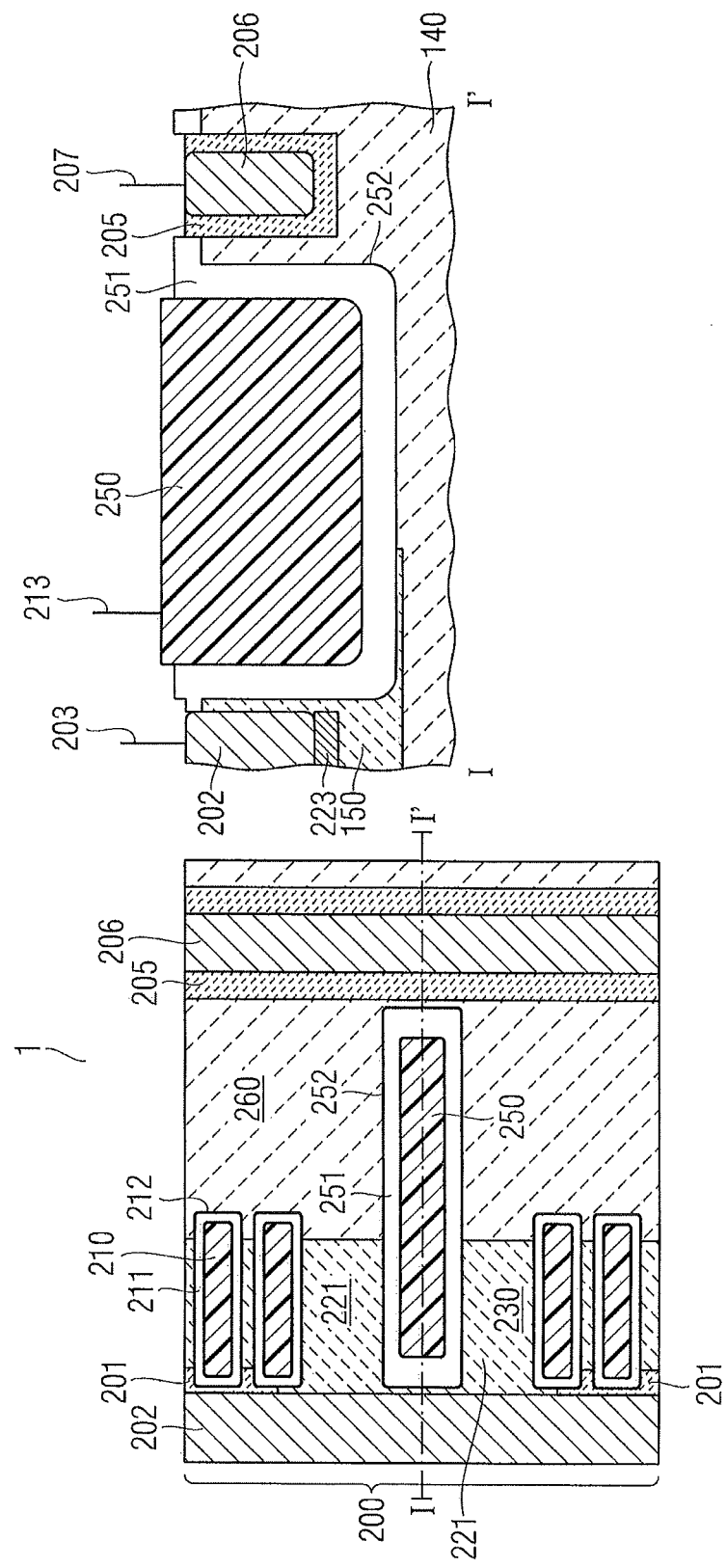
FIG. 4A shows a horizontal cross-sectional view of a semiconductor device according to a further embodiment.
FIG. 4B shows a vertical cross-sectional view of the semiconductor device shown in FIG. 4A.

FIGS. 4A and 4B show a further embodiment of the transistor. According to the embodiment shown in FIGS. 4A and 4B, the field plate trench 252 may extend into the body region 230.

FIG. 4A shows a horizontal cross-sectional view of a semiconductor device. As is shown, the body region 230 comprises two second ridges 221. A gate trench 212 is disposed on one side of the second ridge, and the field plate trench 252 is disposed on the other side of the second ridge 221. The field plate 250 may be electrically coupled to the gate terminal 213. A thickness of the field dielectric layer 251 may be larger than a thickness of the gate dielectric layer 211. According to an example, the thickness of the field dielectric layer 251 may vary. For example, the thickness may be larger between the field plate 250 and the adjacent drift zone 260 than between the field plate 250 and the adjacent body region 230. The field plate trench 252 extends from the body region 230 to the drift zone 260. When the gate terminal 213 is set to an appropriate potential, a conductive inversion channel for holes may be formed at the interface between the field dielectric layer 251 and the drift zone 260. As a result, holes may be more effectively removed from the drift zone 260.

FIG. 4B shows a vertical cross-sectional view of the semiconductor device. As is shown, the field plate 250 laterally extends from the body region 230 to the drift zone 260. The source region 201 may be absent from the region in which the field plate 250 is disposed.

According to the embodiment of FIGS. 4A and 4B, a conductive material disposed in the trench 252 adjacent to the second ridge 221 is electrically connected to the gate terminal 213. According to a further embodiment, the conductive material may be electrically connected to a different terminal, e.g. the source terminal 203. According to still a further embodiment, an insulating material may be arranged in the trench 252 in a region adjacent to the body region 230, and a conductive material may be arranged in a region adjacent to the drift zone 260. This conductive material may be electrically connected to a source terminal 203.

According to further embodiments, the field plates may also be implemented as planar field plates. Further, several field plates may be disposed in the drift zone. According to further embodiments, the drift zone 260 may be further modified, e.g. may be implemented by a p-n superjunction layer stack.

Figure 4C:
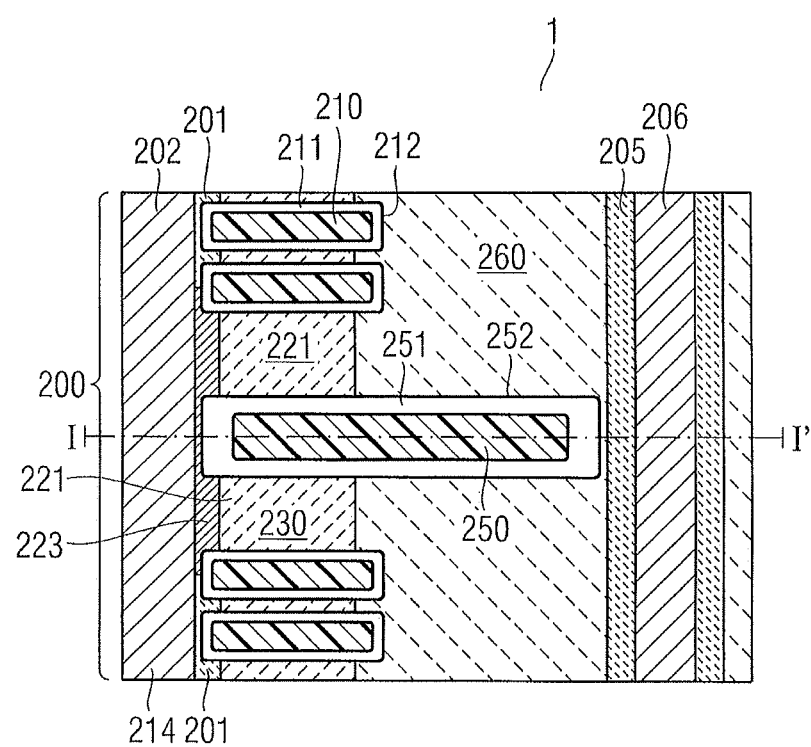
FIG. 4C shows a horizontal cross-sectional view of a semiconductor device according to a further embodiment.

FIG. 4C shows a horizontal cross-sectional view of a semiconductor device according to a further embodiment. As is shown, the semiconductor device further comprises a doped layer 223 of the second conductivity type which is disposed adjacent to a sidewall of the source contact groove 214. The doped layer 223 of the second conductivity type is formed so as to be adjacent to the body regions 230 of the second ridges 221. In particular, the doped layer 223 of the second conductivity type is disposed adjacent to the trench 252 in which the field plate 250 is disposed. As a consequence, holes which may be generated in the drift zone 260 may be more effectively removed.

Figure 5A:
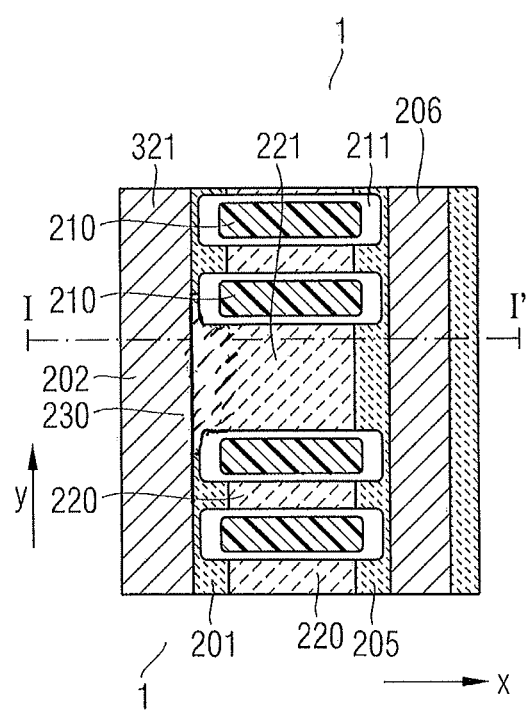
FIG. 5A shows a horizontal cross-sectional view of a semiconductor device according to a further embodiment.
Figure 5B:
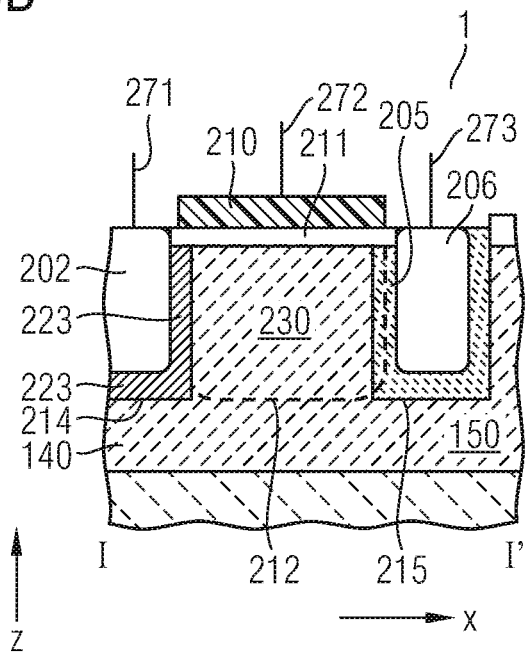
FIG. 5B shows a vertical cross-sectional view of the semiconductor device shown in FIG. 5A.
Figure 5C:
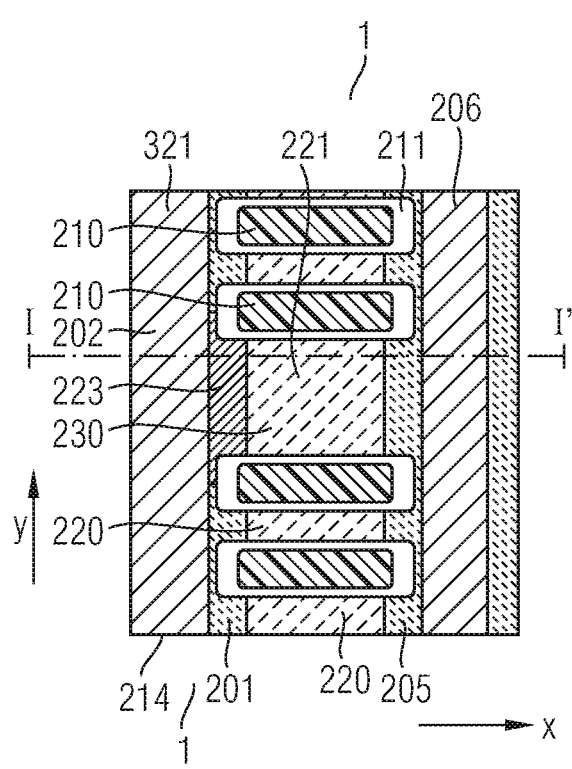
FIG. 5C shows a horizontal cross-sectional view of a semiconductor device according to a further embodiment.

FIGS. 5A to 5C show a further embodiment of the semiconductor device. FIG. 5A shows a horizontal cross-sectional view of the semiconductor device. The semiconductor device illustrated in FIGS. 5A to 5C is similar to the semiconductor device illustrated in FIGS. 1A to 1E. Differing from the embodiment illustrated in FIGS. 1A to 1E, a drift zone is absent from the semiconductor device. Accordingly, the drain region 205 is directly adjacent to the body region 230 comprising first ridges 220 and second ridges 221. Accordingly, the semiconductor device implements a so-called low voltage MOSFET which may be operated at lower voltages than usual power transistors. For example, the semiconductor device illustrated in FIGS. 5A to 5C may be operated at voltages lower than 40 V. Due to this special arrangement of the gate trenches 212 resulting in first ridges and second ridges, the on-state resistance $R_{on}*A$ may be further improved, resulting in a reduced area of the semiconductor device.

FIG. 5B shows a vertical cross-sectional view of the semiconductor device shown in FIG. 5A. For example, the cross-sectional view of FIG. 5B may be taken between I and I' as is also indicated in FIG. 5A. As is shown, the source contact groove 214 and the drain contact groove 215 may be arranged in the well 150 of the second conductivity type so that the drain region 205 is directly adjacent to the body region 230, the drain contact 206 being directly adjacent to the drain region 205.

FIG. 5C shows a further embodiment of the semiconductor device. The semiconductor device shown in FIG. 5C is similar to the semiconductor device shown in FIG. 5A. Differing from the embodiment illustrated in FIG. 5A, the semiconductor device of FIG. 5C comprises a doped layer 223 of the second conductivity type which is arranged adjacent to a sidewall of the source contact groove 214. The doped layer 223 of the second conductivity type is formed adjacent to the source region 201. The source region 201 is not disposed adjacent to the second ridge 221, so that the formation of a transistor in this area may be prevented. As a result, the I-V characteristics of the transistor may be further improved and the steepness of this characteristic may be maintained.

The semiconductor device 1 comprises a plurality of single transistors 10 which may be connected in parallel. The pattern of the single transistors 10 may be repeated and mirrored along the first and the second directions. Generally, a semiconductor device may comprise an active portion and an edge portion. A plurality of single transistors may implement the active portion. Further, the edge termination portion may comprise edge termination devices that are especially adapted to remove or compensate electrical fields at the edge of the semiconductor device. According to an embodiment, the transistor is a component of the active portion.

According to a further interpretation, a semiconductor device 1 comprises an array of field effect transistors 200 in a semiconductor body 100 having a first main surface 110. The array of field effect transistors 200 includes a source region 201, a drain region 205, a body region 230, and a gate electrode 210 disposed in first gate trenches 212 extending in a first direction parallel to the first main surface 110. The body region 230 is disposed along the first direction between the source region 201 and the drain region 205. The first gate trenches 212 are disposed at a first distance d along a second direction perpendicular to the first direction parallel to the first main surface 110. The semiconductor comprises a second gate trench, wherein a second distance b between the second gate trench and an adjacent one of the first gate trenches is larger than the first distance. For example, in the embodiment of FIGS. 1A to 3B and 5A to 5C, the second gate trench may be, e.g. the gate trench that is disposed on one side of the second ridge 221, and the first gate trenches are disposed on the other side of the second ridge 221. In the embodiment shown in FIGS. 4A and 4B, the second gate trench may be implemented by the field plate trench 252 that extends from the body region 230 to the drift zone 260.

For example, according to this interpretation, first portions 220 of the body region are disposed between the first gate trenches. Further, a second portion 221 of the body region 230 may be disposed between the second gate trench and an adjacent one of the first gate trenches 212. The second portion 221 of the body region 230 may directly contact a source contact 202.

As is illustrated in FIGS. 1A to 5C, the source contact 202 and the drain contact 206 of the transistor may be arranged so as to be connected to a source terminal 271 or a drain terminal 273 from a side adjacent to the first main surface 110 of the semiconductor substrate 100. As is clearly to be understood, any of the source contact 202 and the drain contact 206 may also be arranged so as to be connected to a corresponding terminal from a side adjacent to the second main surface 120 of the semiconductor substrate 100. For example, the source contact 202 may be connected to the source terminal 271 from the side adjacent to the first main surface 110, and the drain contact 206 may be connected to the drain terminal 273 from the side adjacent to the second main surface 120 or vice versa. As a result a "quasi-vertical" semiconductor device which may be contacted from opposite sides of the semiconductor substrate may be implemented.

According to an embodiment, the semiconductor device may implement a converter, e.g. a DC-DC converter. According to a further embodiment, the semiconductor device may be a component of a power supply, e.g. a switched mode power supply or of a motor drive.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. A semiconductor device comprising a transistor in a semiconductor body having a first main surface, the transistor comprising:
    a source region of a first conductivity type;
    a drain region;
    a body region of a second conductivity type, different from the first conductivity type; and
    a gate electrode disposed in separate and individual gate trenches extending in a first direction parallel to the first main surface, the source region, the body region and the drain region being disposed along the first direction, the body region being patterned into first ridges and a second ridge, each of the first ridges and the second ridge extending along the first direction, wherein a first one of the first ridges is disposed between first adjacent gate trenches, a second one of the first ridges is disposed between second adjacent gate trenches and the second ridge is disposed between a nearest one of the first adjacent gate trenches and a nearest one of the second adjacent gate trenches, and
    wherein a width of the second ridge is larger than a width of the first ridges, the widths being measured in a second direction perpendicular to the first direction.

2. The semiconductor device according to claim 1, wherein the width d of the first ridges fulfills: d≤2×ld, wherein ld denotes a length of a depletion zone formed at an interface between the first ridge and the gate electrode, and a width b of the second ridge fulfills: b>2×ld.

3. The semiconductor device according to claim 1, further comprising a source contact in contact with the source region, wherein the second ridge is in contact with the source contact.

4. The semiconductor device according to claim 1, further comprising a drift zone between the body region and the drain region.

5. The semiconductor device according to claim 4, further comprising a field plate adjacent to the drift zone.

6. The semiconductor device according to claim 5, wherein the field plate is disposed in a field plate trench formed in the first main surface.

7. The semiconductor device according to claim 5, wherein the field plate is electrically connected to a gate terminal.

8. The semiconductor device according to claim 5, wherein a portion of the field plate extends to the body region.

9. The semiconductor device according to claim 4, further comprising a field plate disposed in a field plate trench in the first main surface and extending in the first direction, a portion of the field plate trench being arranged in the body region, wherein the second ridge is disposed between one of the gate trenches and the field plate trench.

10. The semiconductor device according to claim 3, wherein the source contact is disposed in a source contact groove formed in the first main surface.

11. The semiconductor device according to claim 3, further comprising a doped layer of the second conductivity type in contact with the source contact and the second ridge.

12. The semiconductor device according to claim 11, wherein the doped layer vertically extends from the first main surface along the source contact.

13. The semiconductor device according to claim 11, wherein the doped layer of the second conductivity type laterally extends between adjacent source regions and contacts adjacent source regions.

14. The semiconductor device according to claim 1, wherein the drain region is disposed directly adjacent to the body region.

15. A semiconductor device comprising an array of field effect transistors in a semiconductor body having a first main surface, the array of field effect transistors including:
    a source region;
    a drain region;
    a body region; and
    a gate electrode disposed in first gate trenches and a second trench extending in a first direction parallel to the first main surface, the source region, the body region and the drain region being arranged along the first direction, wherein the first gate trenches are disposed at a first distance along a second direction perpendicular to the first direction parallel to the first main surface, wherein the second gate trench is disposed at a second distance along the second direction from an adjacent one of the first gate trenches, and wherein the second distance is larger than the first distance.

16. The semiconductor device according to claim 15, further comprising a drift zone.

17. The semiconductor device according to claim 16, wherein the second gate trench extends to the drift zone.

18. The semiconductor device according to claim 15, wherein first portions of the body region are disposed between the first gate trenches.

19. The semiconductor device according to claim 15, wherein first portions of the body region are disposed between the first gate trenches and a second portion of the body region is disposed between the second gate trench and a gate trench of the first gate trenches that is adjacent to the second gate trench.

* * * * *